(12) United States Patent
Mizushima

(10) Patent No.: US 9,257,552 B2
(45) Date of Patent: Feb. 9, 2016

(54) SEMICONDUCTOR DEVICE AND METHOD OF MANUFACTURING SAME

(71) Applicant: KABUSHIKI KAISHA TOSHIBA, Minato-Ku, Tokyo (JP)

(72) Inventor: Ichiro Mizushima, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/183,010

(22) Filed: Feb. 18, 2014

(65) Prior Publication Data

US 2015/0060998 A1 Mar. 5, 2015

(30) Foreign Application Priority Data

Sep. 5, 2013 (JP) ................. 2013-184259

(51) Int. Cl.
*H01L 29/66* (2006.01)
*H01L 29/78* (2006.01)
*H01L 29/792* (2006.01)
*H01L 27/115* (2006.01)

(52) U.S. Cl.
CPC ...... *H01L 29/7827* (2013.01); *H01L 27/11582* (2013.01); *H01L 29/66666* (2013.01); *H01L 29/66833* (2013.01); *H01L 29/7926* (2013.01)

(58) Field of Classification Search
CPC ................ H01L 21/02606; H01L 29/0676; H01L 29/0665; H01L 51/057
See application file for complete search history.

(56) References Cited

U.S. PATENT DOCUMENTS

| | | | |
|---|---|---|---|
| 7,936,004 B2 | 5/2011 | Kito et al. | |
| 8,278,695 B2 | 10/2012 | Kidoh et al. | |
| 8,551,838 B2 | 10/2013 | Kito et al. | |
| 2007/0252201 A1 | 11/2007 | Kito et al. | |
| 2008/0067583 A1 | 3/2008 | Kidoh et al. | |
| 2009/0026541 A1* | 1/2009 | Chung | 257/347 |
| 2011/0284947 A1 | 11/2011 | Kito et al. | |
| 2011/0287597 A1 | 11/2011 | Kito et al. | |
| 2012/0001249 A1* | 1/2012 | Alsmeier et al. | 257/319 |

FOREIGN PATENT DOCUMENTS

| | | |
|---|---|---|
| JP | 2006-5205 | 1/2006 |
| JP | 2010-283381 | 12/2010 |
| JP | 2012-222274 | 11/2012 |

OTHER PUBLICATIONS

Tomioka, K. et al., "Selective-Area Growth of III-V Nanowires and Their Applications," J. Mater. Res., vol. 26, No. 17, pp. 2127-2141 (2011).

* cited by examiner

*Primary Examiner* — Thomas L Dickey
(74) *Attorney, Agent, or Firm* — Finnegan, Henderson, Farabow, Garrett & Dunner, L.L.P.

(57) ABSTRACT

In one embodiment, a method of manufacturing a semiconductor device includes forming, on a semiconductor substrate, a sacrificial semiconductor pillar having a pillar-like shape extending in a first direction perpendicular to a main surface of the semiconductor substrate, and being formed of a first semiconductor material. The method further includes forming, around the sacrificial semiconductor pillar, a channel semiconductor layer having a tube-like shape extending in the first direction, and being formed of a second semiconductor material different from the first semiconductor material. The method further includes removing the sacrificial semiconductor pillar after the channel semiconductor layer is formed. The channel semiconductor layer is formed on electrode layers via an insulator, the electrode layers being formed on the semiconductor substrate.

15 Claims, 6 Drawing Sheets

US 9,257,552 B2

SEMICONDUCTOR DEVICE AND METHOD OF MANUFACTURING SAME

CROSS REFERENCE TO RELATED APPLICATION

This application is based upon and claims the benefit of priority from the prior Japanese Patent Application No. 2013-184259, filed on Sep. 5, 2013, the entire contents of which are incorporated herein by reference.

FIELD

Embodiments described herein relate to a semiconductor device and a method of manufacturing the same.

BACKGROUND

In general, a cell transistor of a conventional semiconductor memory device includes its channel in a semiconductor substrate. On the other hand, it has been recently considered to propose a cell transistor including its channel in a semiconductor layer formed on a semiconductor substrate. For example, a cell transistor of a bit cost scalable (BICS) flash memory includes its channel in a semiconductor layer which has a tube-like shape extending in the vertical direction.

DETAILED DESCRIPTION

Embodiments will now be explained with reference to the accompanying drawings.

In one embodiment, a method of manufacturing a semiconductor device includes forming, on a semiconductor substrate, a sacrificial semiconductor pillar having a pillar-like shape extending in a first direction perpendicular to a main surface of the semiconductor substrate, and being formed of a first semiconductor material. The method further includes forming, around the sacrificial semiconductor pillar, a channel semiconductor layer having a tube-like shape extending in the first direction, and being formed of a second semiconductor material different from the first semiconductor material. The method further includes removing the sacrificial semiconductor pillar after the channel semiconductor layer is formed. The channel semiconductor layer is formed on electrode layers via an insulator, the electrode layers being formed on the semiconductor substrate.

First Embodiment

Figure 1:
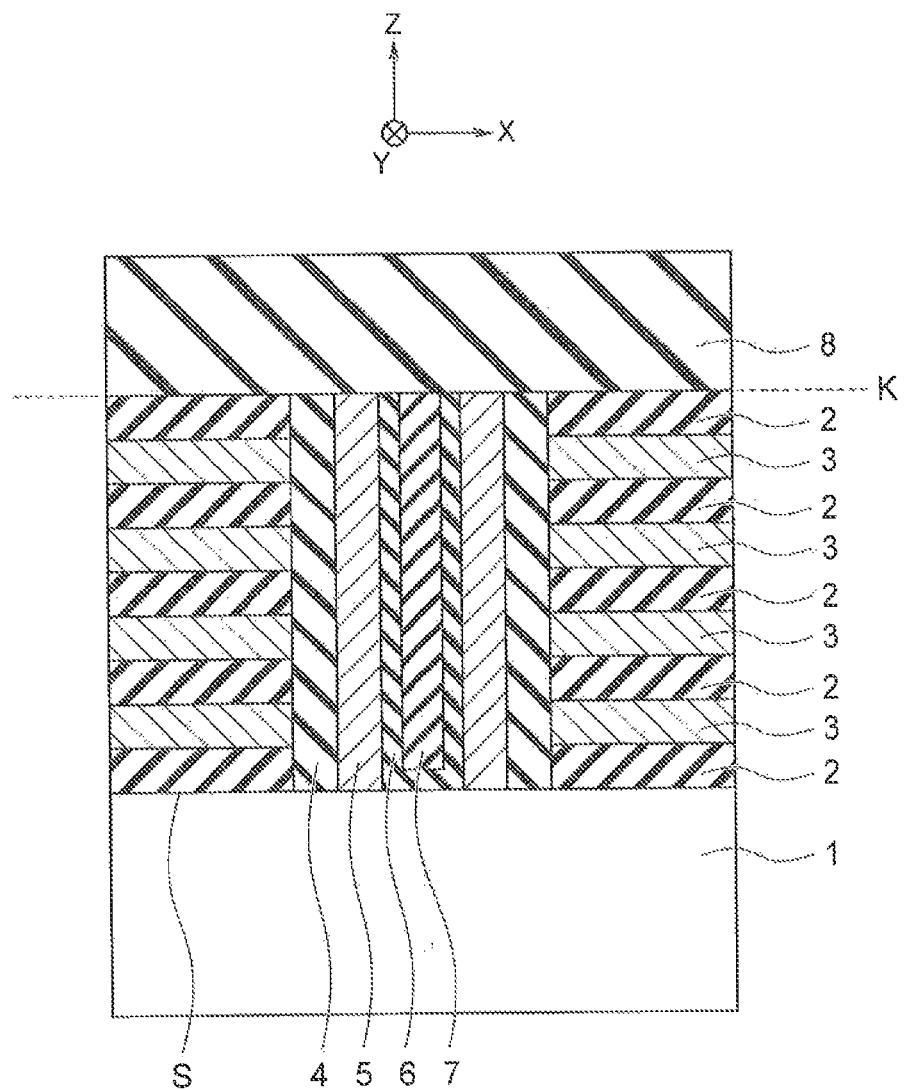
FIG. 1 is a cross-sectional view illustrating a structure of a semiconductor device of a first embodiment.
Figure 2:
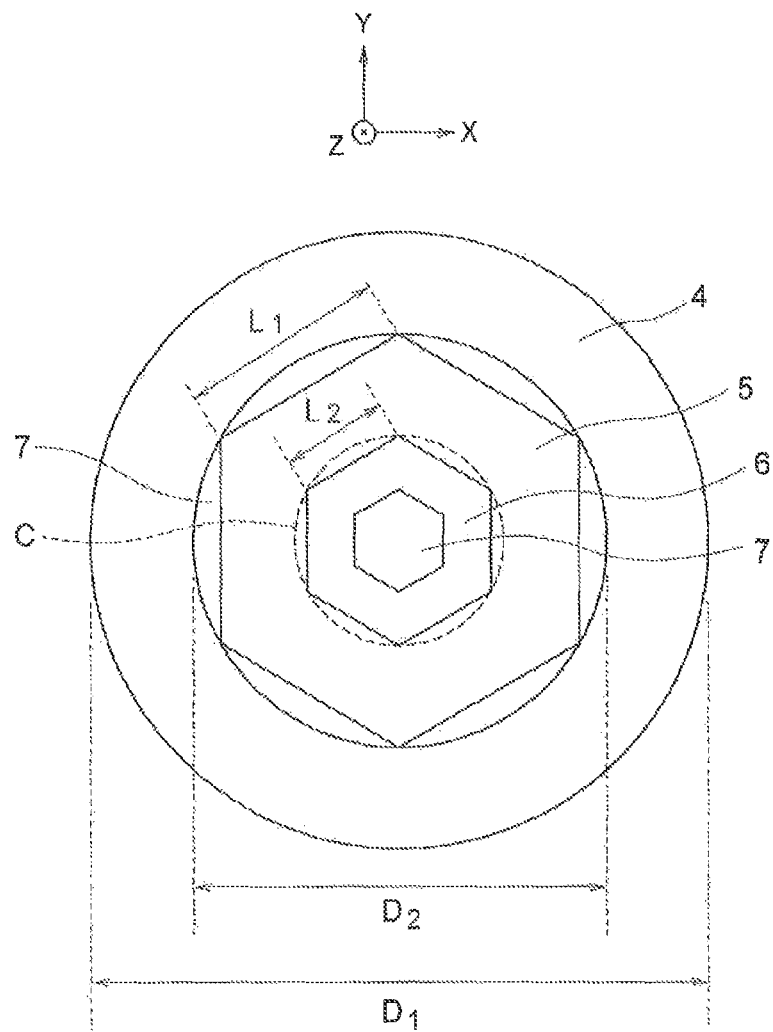
FIG. 2 is a plan view schematically illustrating the structure of the semiconductor device of the first embodiment.

FIG. 1 is a cross-sectional view illustrating a structure of a semiconductor device of a first embodiment. FIG. 2 is a plan view schematically illustrating the structure of the semiconductor device of the first embodiment. FIG. 2 is a cross-sectional view taken along a plane K shown in FIG. 1. FIG. 2 shows a part of components shown in FIG. 1. The semiconductor device of the present embodiment is a BICS flash memory.

Mainly referring to FIG. 1, the structure of the semiconductor device of the present embodiment is described below. In the description below, FIG. 2 is also referred to where it is appropriate.

The semiconductor device of the present embodiment includes a semiconductor substrate 1, insulating layers 2, electrode layers 3, a memory insulator 4, a channel semiconductor layer 5, a first insulator 6, a second insulator 7, and an intermediate dielectric layer 8.

The semiconductor substrate 1 is, for example, a silicon substrate. FIG. 1 shows a X-direction and a Y-direction that are parallel to a main surface S of the semiconductor substrate 1 and are perpendicular to each other, and a Z-direction that is perpendicular to the main surface S of the semiconductor substrate 1. The Z-direction is an example of a first direction of the disclosure. The main surface S of the semiconductor substrate 1 is a (111)-plane.

In this specification, the +Z-direction is regarded as an upward direction, and the −Z-direction is regarded as a downward direction. For example, the positional relationship between the semiconductor substrate 1 and the intermediate dielectric layer 8 is expressed that the intermediate dielectric layer 8 is located above the semiconductor substrate 1.

The insulating layers 2 and the electrode layers 3 are alternately stacked on the semiconductor substrate 1. The insulating layers 2 are, for example, silicon oxide films. The electrode layers 3 are, for example, polysilicon layers including dopant impurities such as P (phosphorus) or B (boron) at a high concentration, and functioning as electrodes. The insulating layers 2 and the electrode layers 3 are adjacent to the channel semiconductor layer 5 via the memory insulator 4. The electrode layers 3 function as word lines or select gates of the BiCS flash memory.

The memory insulator 4 has a tube-like (or pipe-like) shape extending in the Z-direction as shown in FIG. 2. The cross-sectional shapes of the outer surface and the inner surface of the memory insulator 4 perpendicular to the 2-direction are circular shapes. The reference signs $D_1$ and $D_2$ respectively represent the diameters of the outer surface and the inner surface of the memory insulator 4. The memory insulator 4 is, for example, an ONO stack film including a first silicon oxide film, a silicon nitride film, and a second silicon oxide film. The outer surface of the memory insulator 4 is surrounded by the insulating layers 2 and the electrode layers 3.

The channel semiconductor layer 5 has a tube-like shape extending in the Z-direction as shown in FIG. 2. The cross-sectional shapes of the outer wall surface and the inner wall surface of the channel semiconductor layer 5 perpendicular to the Z-direction are hexagonal shapes, more specifically, almost regular hexagons. The reference signs $L_1$ and $L_2$ respectively represent the lengths of the sides of the hexagons of the outer wall surface and the inner wall surface of the channel semiconductor layer 5. For example, the length $L_1$ is 15 nm, and the length $L_2$ is 5 nm. The channel semiconductor layer 5 is, for example, a monocrystal semiconductor layer, more specifically, a monocrystal silicon layer. This monocrystal silicon layer may include n-type impurities, p-type impurities, nitrogen atoms or the like. The outer wall surface of the channel semiconductor layer 5 is surrounded by the insulating layers 2 and the electrode layers 3 via the memory insulator 4. The channel semiconductor layer 5 functions as a channel of cell transistors or select transistors.

Regarding the cross-sectional shapes of the outer wall surface and the inner wall surface of the channel semiconductor layer 5, a hexagonal shape may refer not only to a shape having six straight sides, but also to a shape having one or more gently-curved sides among the six sides, or a shape having small concave and convex portions in one or more of the six sides, for example. Furthermore, the hexagonal shape may refer to a shape having one or more rounded corners among the six corners. In addition, the hexagonal shape may refer to a shape which almost has a 6-fold symmetry and can be substantially recognized as a hexagon. The same applies to the later described cases where other components have hexagonal shapes.

The first insulator 6 is formed on the inner wall surface of the channel semiconductor layer 5 and the main surface S of the semiconductor substrate 1. The first insulator 6 has a tube-like shape extending in the Z-direction as shown in FIG. 2. The cross-sectional shapes of the outer surface and the inner surface of the first insulator 6 perpendicular to the Z-direction are hexagonal shapes, more specifically, almost regular hexagons. The first insulator 6 is, for example, a silicon nitride film or a silicon oxide film.

The second insulator 7 is formed on the inner side of the inner wall surface of the channel semiconductor layer 5 via the first insulator 6. The second insulator 7 has a pillar-like (or column-like) shape extending in the Z-direction as shown in FIG. 2. The cross-sectional shape of the second insulator 7 perpendicular to the Z-direction is a hexagonal shape, more specifically, an almost regular hexagon. The second insulator 7 is, for example, a silicon oxide film or a silicon nitride film. As shown in FIG. 2, the second insulator 7 of the present embodiment is also formed between the memory insulator 4 and the channel semiconductor layer 5.

The intermediate dielectric layer 8 is formed on the entire surface on the semiconductor substrate 1 so as to cover the insulating layers 2, the electrode layers 3, the memory insulator 4, the channel semiconductor layer 5, the first insulator 6, and the second insulator 7. The Intermediate dielectric layer 8 is, for example, a silicon oxide film.

FIGS. 3A to 5C are cross-sectional views illustrating a method of manufacturing the semiconductor device of the first embodiment.

Figure 3A:
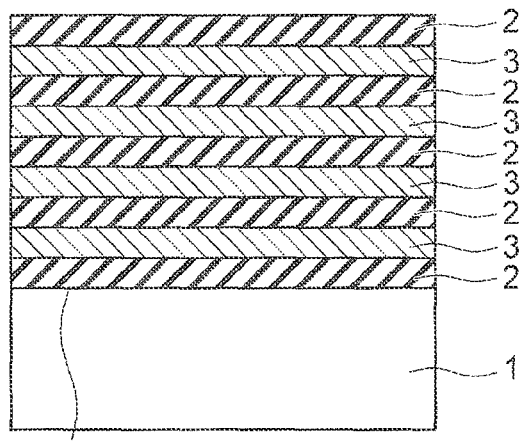
FIGS. 3A to 3C are cross-sectional views illustrating a method of manufacturing the semiconductor device of the first embodiment.

First, as shown in FIG. 3A, the insulating layers 2 and the electrode layers 3 are alternately stacked on the semiconductor substrate 1.

Figure 3B:
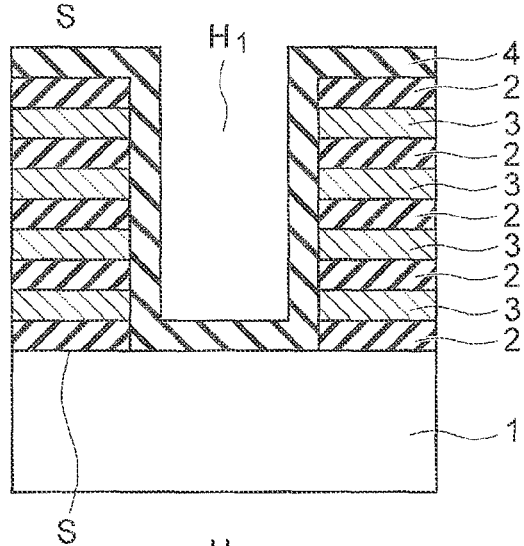

Next, as shown in FIG. 3B, a hole $H_1$ penetrating the insulating layers 2 and the electrode layers 3 to reach the main surface S of the semiconductor substrate 1 is formed by lithography and etching. The cross-sectional shape of the hole $H_1$ is a circular shape with the diameter $D_1$ (see FIG. 2).

As shown in FIG. 3B, the memory insulator 4 is then formed on the entire surface of the semiconductor substrate 1. As a result, the memory insulator 4 is formed on the side surface and the bottom surface of the hole $H_1$.

Figure 3C:
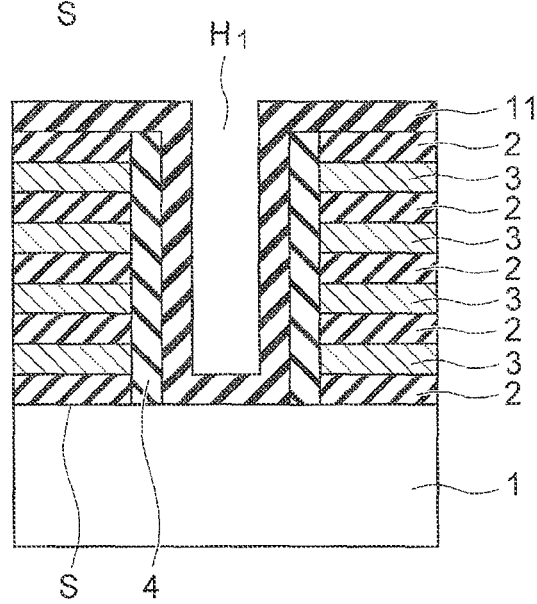

As shown in FIG. 3C, the memory insulator 4 on the bottom surface of the hole $H_1$ is removed by lithography and etching. As a result, the main surface S of the semiconductor substrate 1 is exposed through the bottom surface of the hole $H_1$.

As shown in FIG. 3C, a sacrificial film 11 is then formed on the entire surface of the semiconductor substrate 1. As a result, the sacrificial film 11 is formed on the side surface and the bottom surface of the hole $H_1$. The memory insulator 4 and the sacrificial film 11 are formed in this order on the bottom surface of the hole $H_1$. The sacrificial film 11 is, for example, an $Al_2O_3$ (aluminum oxide) film. The sacrificial film 11 is formed so that the cross-sectional shape of its inner surface becomes a circular shape C shown in FIG. 2. The diameter of the circle C is $2L_2$.

Figure 4A:
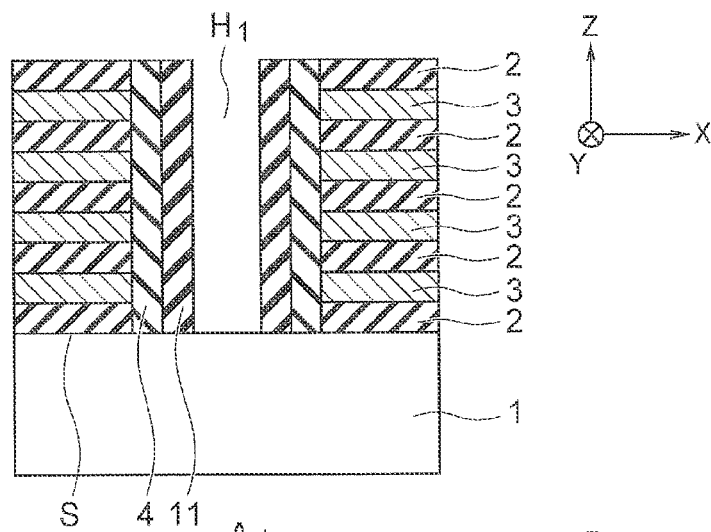
FIGS. 4A to 4C are additional cross-sectional views illustrating the method of manufacturing the semiconductor device of the first embodiment.

As shown in FIG. 4A, the sacrificial film 11 on the bottom surface of the hole $H_1$ is removed by lithography and etching. As a result, the main surface S of the semiconductor substrate 1 is exposed through the bottom surface of the hole $H_1$.

Figure 4B:
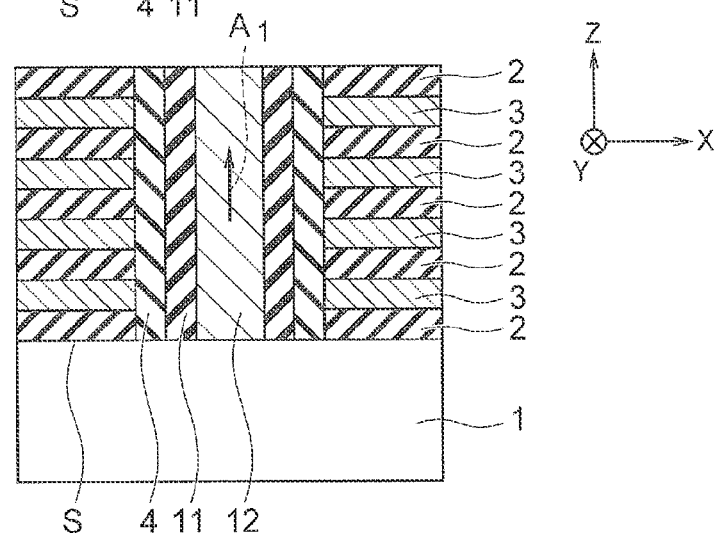

As shown in FIG. 4B, a sacrificial semiconductor pillar 12 is then grown from the main surface S of the semiconductor substrate 1, where the main surface S of the semiconductor substrate 1 is a (111)-plane. As a result, the sacrificial semiconductor pillar 12 grows in the Z-direction as indicated by the arrow $A_1$, so that the sacrificial semiconductor pillar 12 is formed in the hole $H_1$ via the memory insulator 4 and the sacrificial film 11. The sacrificial semiconductor pillar 12 has a pillar-like shape extending in the Z-direction. The length of the sacrificial semiconductor pillar 12 in the Z-direction can be controlled by adjusting the growth time of the sacrificial semiconductor pillar 12.

The sacrificial semiconductor pillar 12 is, for example, a group III-V compound semiconductor pillar such as a GaAs (gallium arsenide) pillar. A group III-V compound semiconductor such as GaAs is an example of a first semiconductor material of the disclosure. The sacrificial semiconductor pillar 12 of the present embodiment is a monocrystal semiconductor pillar formed of the group III-V compound semiconductor such as GaAs. This monocrystal semiconductor is an example of a first monocrystal semiconductor material of the disclosure. For example, when the sacrificial semiconductor pillar 12 is a GaAs pillar, the film growth temperature for the sacrificial semiconductor pillar 12 is set at 500° C., and the sacrificial semiconductor pillar 12 can be grown by CVD using trimethyl gallium (TMGa) and ammonia ($NH_3$) as gases. At this point, the growth rate in the vertical direction (Z-direction) is made higher than the growth rate in the horizontal direction (X-direction and Y-direction) by adjusting the conditions for growing the sacrificial semiconductor pillar 12, so that a long and thin monocrystal pillar extending in the vertical direction can be formed.

After the growth of the sacrificial semiconductor pillar 12 in the vertical direction, the sacrificial semiconductor pillar 12 can also be grown in the horizontal direction so that the height of the sacrificial semiconductor pillar 12 in the vertical direction is not increased, by making the sacrificial semiconductor pillar 12 grow under the conditions different from those when the sacrificial semiconductor pillar 12 grows in the vertical direction. This makes it possible to vary the length $L_2$ of the sacrificial semiconductor pillar 12 without varying the thickness of the semiconductor film 11. Examples of a method of changing the growth direction of the sacrificial semiconductor pillar 12 are to increase the growth temperature and to increase a partial pressure of $AsH_3$ in a source gas for the sacrificial semiconductor pillar 12.

Instead of the GaAs pillar, the sacrificial semiconductor pillar 12 may be a GaP (gallium phosphorus) pillar, an InP (indium phosphorus) pillar, an InAs (indium arsenide) pillar, or a ternary material pillar or a quaternary material pillar containing at least three of Ga, In, As and P. Alternatively, the sacrificial semiconductor pillar 12 may be a compound semiconductor pillar containing some other group III and V elements, or a compound material pillar containing group II and VI elements.

The cross-sectional shape of the sacrificial semiconductor pillar 12 perpendicular to the Z-direction becomes a hexagonal shape (more particularly, an almost regular hexagon) by virtue of the main surface S of the semiconductor substrate 1 which is a (111)-plane. Furthermore, since the sacrificial semiconductor pillar 12 grows in a region surrounded by the inner surface of the sacrificial film 11 with the diameter $2L_2$, the length of each side of the hexagon of the outer wall surface of the sacrificial semiconductor pillar 12 becomes $L_2$. In the step shown in FIG. 4B, spaces are left between the inner surface of the sacrificial film 11 having a circular cross-section and the outer wall surface of the sacrificial semiconductor pillar 12 having a hexagonal cross-section. That is, the hole $H_1$ of the present embodiment cannot be completely filled with the sacrificial semiconductor pillar 12, and is partially filled with the sacrificial semiconductor pillar 12 leaving the above mentioned spaces.

Figure 4C:
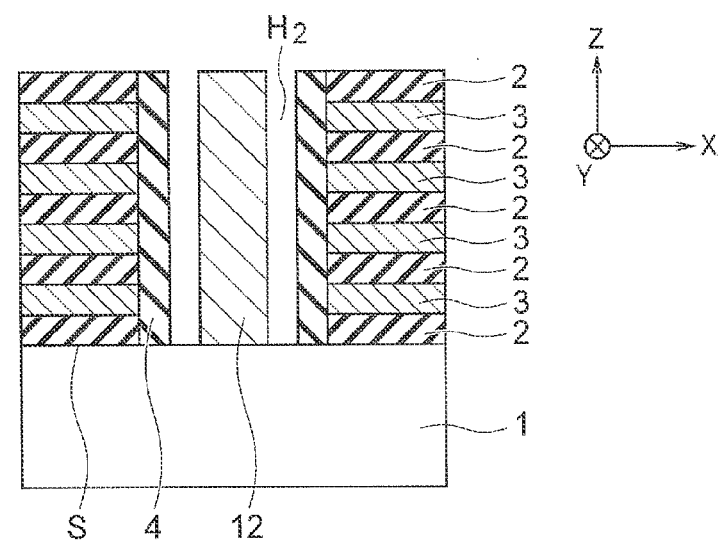

As shown in FIG. 4C, the sacrificial film 11 is removed by selective etching after the sacrificial semiconductor pillar 12 is formed. As a result, a hole $H_2$ is formed between the memory insulator 4 and the sacrificial semiconductor pillar 12. The hole $H_2$ has a tube-like shape extending in the Z-direction.

Figure 5A:
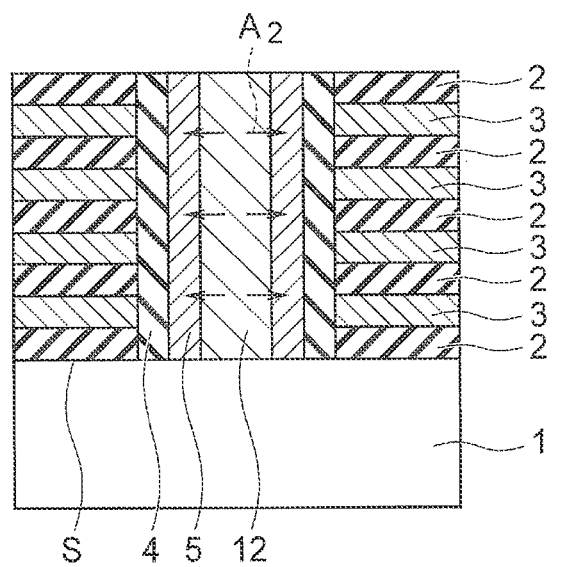
FIGS. 5A to 5C are additional cross-sectional views illustrating the method of manufacturing the semiconductor device of the first embodiment.

As shown in FIG. 5A, the channel semiconductor layer 5 is then grown from the outer wall surface of the sacrificial semiconductor pillar 12. As a result, the channel semiconductor layer 5 radially grows in the hole $H_2$ as indicated by the arrows $A_2$, so that the channel semiconductor layer 5 is formed around the sacrificial semiconductor pillar 12. The sacrificial semiconductor pillar 12 functions as the seed for the channel semiconductor layer 5 to epitaxially grow. The channel semiconductor layer 5 has a tube-like shape extending in the Z-direction.

The channel semiconductor layer 5 is, for example, a monocrystal silicon layer. Monocrystal silicon is an example of a second semiconductor material different from the first semiconductor material, and is an example of a second monocrystal semiconductor material different from the first monocrystal semiconductor material. For example, when the channel semiconductor layer 5 is a monocrystal silicon layer, the channel semiconductor layer 5 is formed by using a dichlorosilane ($SiH_2Cl_2$) gas diluted with hydrogen ($H_2$). At this point, the film formation temperature and the film formation pressure are set at 800° C. and 10 Torr for example, so that the channel semiconductor layer 5 selectively grows only on the surface of the sacrificial semiconductor pillar 12 which is a monocrystal semiconductor layer, and does not grow on the other insulators.

In a case where the main surface S of the semiconductor substrate 1 is a (111)-plane, a monocrystal silicon layer hardly grows on the semiconductor substrate 1 at the bottom surface of the hole $H_2$. Therefore, where the channel semiconductor layer 5 is a monocrystal silicon layer, the channel semiconductor layer 5 substantially grows only from the outer wall surface of the sacrificial semiconductor pillar 12 in the step shown in FIG. 5A.

The channel semiconductor layer 5 may be a monocrystal silicon germanium layer, instead of a monocrystal silicon layer. Also, the channel semiconductor layer 5 may be a monocrystal layer containing silicon and at least one group IV element other than silicon. For example, the channel semiconductor layer 5 may be a monocrystal layer containing silicon and at least one of germanium and carbon, and expressed by a general expression $Si_xGe_yC_{1-x-y}$ where $0<x<1$, $0 \leq y<1$ and $0<x+y \leq 1$. In this case, the channel semiconductor layer 5 containing germanium can be formed by, for example, using a gas containing $GeH_4$. The channel semiconductor layer 5 containing carbon can be formed by, for example, using a gas containing $SiCH_6$. The channel semiconductor layer 5 containing germanium and carbon can be formed by, for example, using a gas containing $GeH_4$ and $SiCH_5$.

Since the channel semiconductor layer 5 grows from the outer wall surface of the sacrificial semiconductor pillar 12, the cross-sectional shapes of the outer wall surface and the inner wall surface of the channel semiconductor layer 5 perpendicular to the Z-direction become hexagonal shapes (or more particularly, almost regular hexagonal shapes), and the length of each side of the hexagon of the inner wall surface of the channel semiconductor layer 5 becomes $L_2$. Also, since the channel semiconductor layer 5 grows in a region surrounded by the inner surface of the memory insulator 4 with the diameter $D_2 (=2L_1)$, the length of each side of the hexagon of the outer wall surface of the channel semiconductor layer 5 becomes $L_1$. In the step shown in FIG. 5A, spaces are left between the inner surface of the memory insulator 4 having a circular cross-section and the outer wall surface of the channel semiconductor layer 5 having a hexagonal cross-section. That is, the hole $H_2$ of the present embodiment is not completely filled with the channel semiconductor layer 5, but is partially filled with the channel semiconductor layer 5 leaving the above mentioned spaces.

Through the step shown in FIG. 5A, the channel semiconductor layer 5 is formed in a position adjacent to the insulating layers 2 and the electrode layers 3 via the memory insulator 4.

Figure 6:
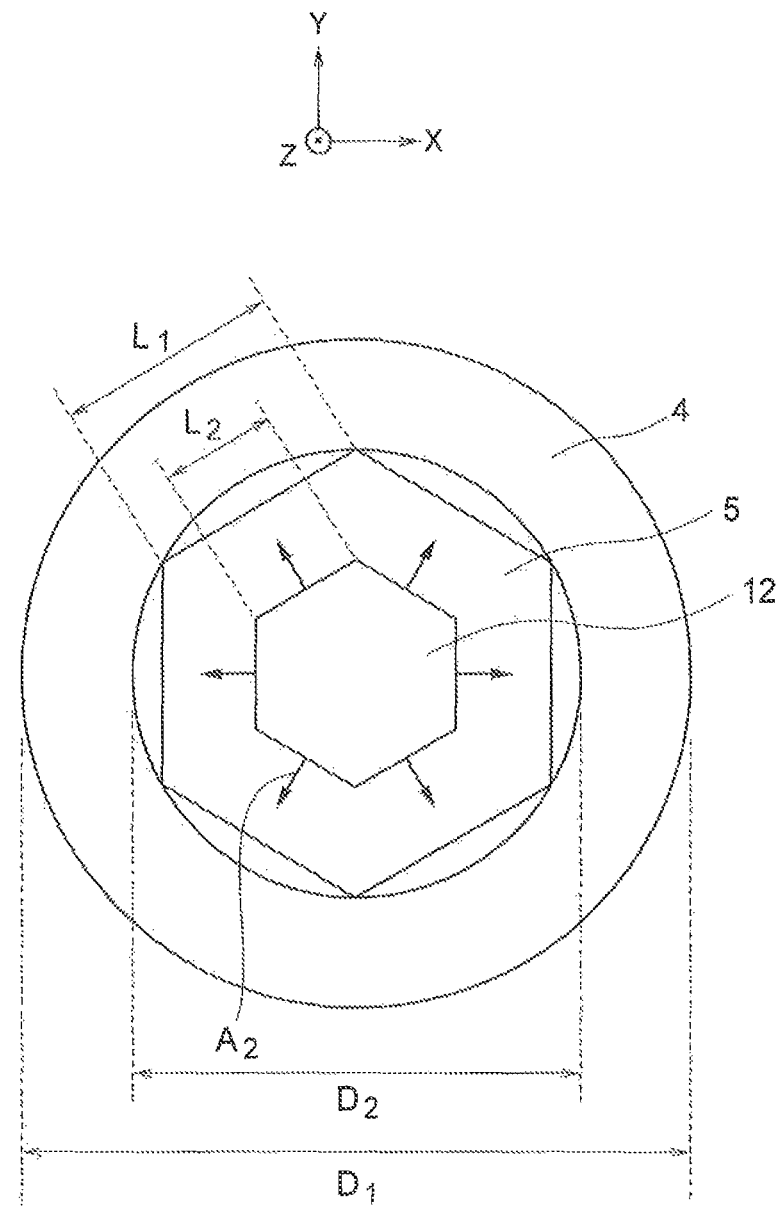
FIG. 6 is a plan view schematically illustrating the method of manufacturing the semiconductor device of the first embodiment.

The planar shape of the channel semiconductor layer 5 is shown in FIG. 6. FIG. 6 is a plan view schematically illustrating the method of manufacturing the semiconductor device of the first embodiment. FIG. 6 is a cross-sectional view taken along the plane K (see FIG. 1). FIG. 6 shows a part of components shown in FIG. 5A. In the step shown in FIG. 5A, the channel semiconductor layer 5 radially grows as indicated by the arrows $A_2$.

Figure 5B:
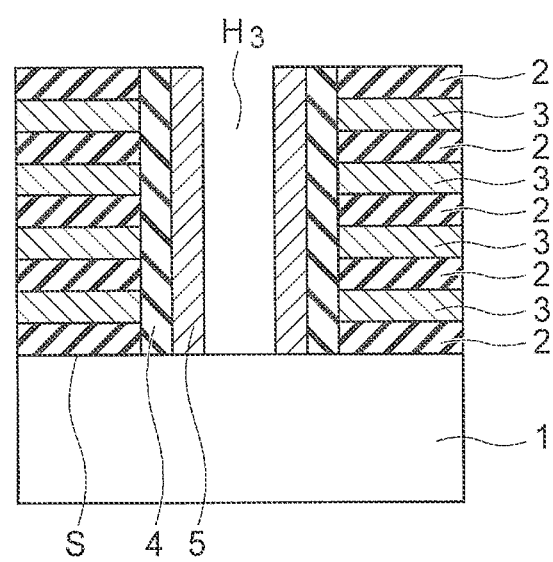

As shown in FIG. 5B, the sacrificial semiconductor pillar 12 is removed by selective etching after the channel semiconductor layer 5 is formed. As a result, a hole $H_3$ is formed in a region surrounded by the inner wall surface of the channel semiconductor layer 5. The cross-sectional shape of the hole $H_3$ is a hexagonal shape having sides of the length $L_2$ (see FIG. 2), or more specifically, is substantially a regular hexagon.

Figure 5C:
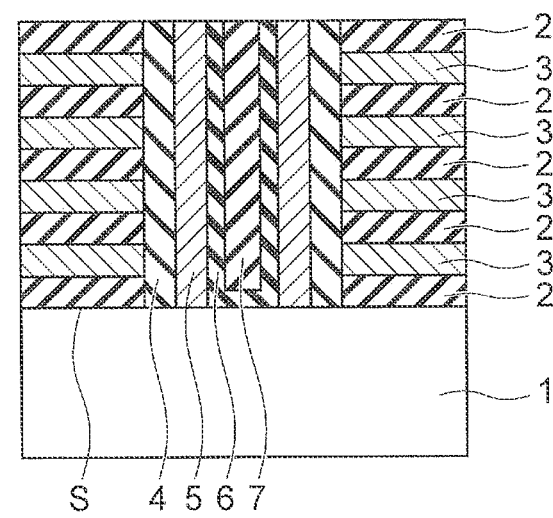

As shown in FIG. 5C, the first insulator 6 is then formed on the inner wall surface of the channel semiconductor layer 5 and on the main surface S of the semiconductor substrate 1. The first insulator 6 is, for example, a silicon nitride film or a silicon oxide film. For example, the first insulator 6 is formed by nitriding or oxidizing the surface of the channel semiconductor layer 5. The first insulator 6 may be some other insulator containing nitrogen or oxygen.

As shown in FIG. 5C, the second insulator 7 is then formed in a region surrounded by the inner wall surface of the channel semiconductor layer 5 via the first insulator 6. The second insulator 7 is, for example, a silicon oxide film or a silicon nitride film. For example, the first and second insulators 6 and 7 having the shapes shown in FIG. 5C are obtained by performing chemical mechanical polishing (CMP) after the first and second insulators 6 and 7 are formed.

After that, the intermediate dielectric layer 8 and the like are formed on the semiconductor substrate 1 in the present embodiment. In this manner, the semiconductor device of the present embodiment is manufactured.

A part of the arsenic atoms in the sacrificial semiconductor pillar 12 may be diffused in the channel semiconductor layer 5 in the steps shown in FIGS. 5A and 5B. Also, a part of the nitrogen atoms in the first insulator 6 may be diffused in the channel semiconductor layer 5. In such cases, the channel semiconductor layer 5 contains the arsenic and nitrogen atoms. For example, the diffusion of the arsenic and nitrogen atoms can be used for adjusting the threshold voltage for a cell transistor or a select transistor.

In the step shown in FIG. 5A, the spaces formed between the inner surface of the memory insulator 4 and the outer wall surface of the channel semiconductor layer 5 may be filled with the second insulator 7 or the intermediate dielectric layer 8, or at least a part of the spaces may be left as air gaps. When the first insulator 6 is formed, some of the atoms in the first insulator 6 may be diffused into the channel semiconductor layer 5, and be caused to precipitate in the spaces or the interfaces between the channel semiconductor layer 5 and the memory insulator 4. FIG. 2 shows an example case where these spaces are filled with the second insulator 7.

For example, the sacrificial semiconductor pillar 12 of the present embodiment is a GaAs (gallium arsenide) layer, and the channel semiconductor layer 5 of the present embodiment is a monocrystal silicon layer. While the lattice constant of monocrystal silicon is 0.543 nm, the lattice constant of regular GaAs having 1:1 as the composition ratio between Ga and As is 0.565 nm. The lattice constant of GaAs is approximately 1.041 times as large as the lattice constant of monocrystal silicon, and has a value that is close to the value of the lattice constant of monocrystal silicon.

When the lattice constants of the sacrificial semiconductor pillar 12 and the channel semiconductor layer 5 are close to each other, crystal defects are not easily generated in the channel semiconductor layer 5. Therefore, the lattice constant of the sacrificial semiconductor pillar 12 of the present embodiment is preferably 0.95 to 1.05 times as large as the lattice constant of monocrystal silicon. Thereby, the present embodiment can suppress the number of crystal defects in the channel semiconductor layer 5 to a number equal to or smaller than the number of crystal defects that are generated in a case where the sacrificial semiconductor pillar 12 and the channel semiconductor layer 5 are respectively a GaAs layer and a monocrystal silicon layer.

More preferably, the lattice constant of the sacrificial semiconductor pillar 12 is set 0.98 to 1.02 times as large as the lattice constant of the channel semiconductor layer 5. In the case where the sacrificial semiconductor pillar 12 and the channel semiconductor layer 5 are respectively the GaAs layer and the monocrystal silicon layer, this can be realized by substituting some of the As atoms in the GaAs layer with P (phosphorus) atoms.

As described above, the method of manufacturing the semiconductor device of the present embodiment includes forming, on the semiconductor substrate 1, the sacrificial semiconductor pillar 12 having a pillar-like shape extending in the Z-direction, and forming, around the sacrificial semiconductor pillar 12, the channel semiconductor layer 5 having a tube-like shape extending in the Z-direction.

In general, a semiconductor layer having a tube-like shape extending in the Z-direction can be formed through a process involving vapor-liquid-solid (VLS) growth or selective-area metal-organic vapor phase epitaxy (SA-MOVPE) growth. However, a simpler formation method is expected.

According to the present embodiment, the channel semiconductor layer 5 can be formed without using a metal catalyst that is normally used in a case where VLS growth is performed. Also, according to the present embodiment, the channel semiconductor layer 5 can be formed without using an amorphous thin-film mask that is normally used in a case where SA-MOVPE growth is performed.

Therefore, according to the present embodiment, the channel semiconductor layer 5 having a tube-like shape can be readily formed. As a result, a transistor having a channel in the channel semiconductor layer 5 can be readily formed according to the present embodiment.

The channel semiconductor layer 5 of the present embodiment has the inner wall surface that has a hexagonal cross-sectional shape, and the inner wall surface is stable in terms of crystals. Therefore, according to the present embodiment, a highly-reliable semiconductor device can be realized by forming a transistor with using the channel semiconductor layer 5.

The semiconductor substrate 1 of the present embodiment has the main surface S that is a (111)-plane. Therefore, the present embodiment makes it possible to readily form the sacrificial semiconductor pillar 12 that has the outer wall surface having a hexagonal cross-sectional shape, and the channel semiconductor layer 5 that has the inner wall surface and the outer wall surface having hexagonal cross-sectional shapes.

The semiconductor device of the present embodiment may include one or more channel semiconductor layers 5, each of which has the structure shown in FIG. 1. Such channel semiconductor layers 5 can be formed by forming plural holes $H_1$ in the step shown in FIG. 3B, and carrying out the steps shown in FIGS. 3C to 5C on the respective holes $H_1$. For example, these channel semiconductor layers 5 are arranged in a quadrangular lattice array or a triangular lattice array on the semiconductor substrate 1.

The present embodiment can also be applied to semiconductor devices other than the BiCS flash memory device.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A method of manufacturing a semiconductor device, comprising:
    forming, on a semiconductor substrate, a sacrificial semiconductor pillar having a pillar-like shape extending in a first direction perpendicular to a main surface of the semiconductor substrate, and being formed of a first semiconductor material;
    forming, around the sacrificial semiconductor pillar, a channel semiconductor layer having a tube-like shape extending in the first direction, and being formed of a second semiconductor material different from the first semiconductor material; and
    removing the sacrificial semiconductor pillar after the channel semiconductor layer is formed,
    wherein the channel semiconductor layer is formed on electrode layers via an insulator, the electrode layers being formed on the semiconductor substrate.

2. The method of claim 1, wherein the sacrificial semiconductor pillar has a hexagonal cross-sectional shape in a plane perpendicular to the first direction.

3. The method of claim 2, wherein at least one side of the hexagonal cross-sectional shape is a curved side.

4. The method of claim 2, wherein at least one corner of the hexagonal cross-sectional shape is a rounded corner.

5. The method of claim 1, wherein a lattice constant of the sacrificial semiconductor pillar is 0.95 to 1.05 times as large as a lattice constant of the channel semiconductor layer.

6. The method of claim 1, wherein the sacrificial semiconductor pillar is a compound semiconductor pillar.

7. The method of claim 1, wherein
the sacrificial semiconductor pillar is formed of a first monocrystal semiconductor material, and
the channel semiconductor layer is formed of a second monocrystal semiconductor material different from the first monocrystal semiconductor material.

8. The method of claim 1, wherein n-type impurities, p-type impurities, or nitrogen atoms are diffused in the channel semiconductor layer.

9. The method of claim 1, wherein an inner wall surface of the channel semiconductor layer has a hexagonal cross-sectional shape in a plane perpendicular to the first direction.

10. The method of claim 1, wherein an outer wall surface of the channel semiconductor layer has a hexagonal cross-sectional shape in a plane perpendicular to the first direction.

11. The method of claim 1, wherein the main surface of the semiconductor substrate is a (111)-plane.

12. The method of claim 1, further comprising:
alternately stacking insulating layers and the electrode layers on the semiconductor substrate;
forming a hole penetrating the insulating layers and the electrode layers to reach the semiconductor substrate;
sequentially forming the insulator and a sacrificial film on a side surface of the hole;
forming the sacrificial semiconductor pillar in the hole to fill the hole via the insulator and the sacrificial film;
removing the sacrificial film after the sacrificial semiconductor pillar is formed; and
forming the channel semiconductor layer around the sacrificial semiconductor pillar after the sacrificial film is removed.

13. The method of claim 12, wherein the sacrificial film is an aluminum oxide film.

14. The method of claim 1, further comprising forming a first insulator on an inner wall surface of the channel semiconductor layer after the sacrificial semiconductor pillar is removed, the first insulator containing nitrogen or oxygen.

15. The method of claim 14, further comprising forming a second insulator on the inner wall surface of the channel semiconductor layer via the first insulator.

\* \* \* \* \*